United States Patent
Roy

(10) Patent No.: US 10,107,854 B2
(45) Date of Patent: *Oct. 23, 2018

(54) SEMICONDUCTOR DEVICE INCLUDING THRESHOLD VOLTAGE MEASUREMENT CIRCUITRY

(71) Applicant: ATOMERA INCORPORATED, Los Gatos, CA (US)

(72) Inventor: Richard Stephen Roy, Dublin, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/678,616

(22) Filed: Aug. 16, 2017

(65) Prior Publication Data

US 2018/0052196 A1 Feb. 22, 2018

Related U.S. Application Data

(60) Provisional application No. 62/375,978, filed on Aug. 17, 2016.

(51) Int. Cl.
*H01L 29/15* (2006.01)
*G01R 31/28* (2006.01)
(Continued)

(52) U.S. Cl.
CPC .. *G01R 31/2831* (2013.01); *H01L 21/823412* (2013.01); *H01L 27/092* (2013.01);
(Continued)

(58) Field of Classification Search
CPC ... H01L 21/70; H01L 21/702; H01L 21/8232; H01L 29/15; H01L 29/68
See application file for complete search history.

(56) References Cited

U.S. PATENT DOCUMENTS 4,937,204 A  6/1990  Ishibashi et al.
5,216,262 A  6/1993  Tsu
(Continued)

FOREIGN PATENT DOCUMENTS

CN  104135236  11/2014
GB  2347520  6/2000
JP  2016140050  8/2016

OTHER PUBLICATIONS

Luo et al., "Chemical Design of Direct-Gap Light-Emitting Silicon" published in Physical Review Letters, vol. 89, No. 7; Aug. 12, 2002; 4 pgs.

(Continued)

*Primary Examiner* — Cheung Lee
(74) *Attorney, Agent, or Firm* — Allen, Dyer, Doppelt, + Gilchrist, P.A.

(57) ABSTRACT

A semiconductor device may include a substrate, active circuitry on the substrate and including differential transistor pairs, and threshold voltage test circuitry on the substrate. The threshold voltage test circuitry may include a pair of differential test transistors replicating the differential transistor pairs within the active circuitry, with each test transistor having a respective input and output, and at least one gain stage configured to amplify a difference between the outputs of the differential test transistors for measuring a threshold voltage thereof. The differential transistor pairs and the pair of differential test transistors may each include spaced apart source and drain regions, a channel region extending between the source and drain regions, and a gate overlying the channel region. Each of the channel regions may include a superlattice.

21 Claims, 21 Drawing Sheets

(51) Int. Cl.
*H01L 27/092* (2006.01)
*H01L 29/78* (2006.01)
*H01L 21/8234* (2006.01)

(52) U.S. Cl.
CPC ........ *H01L 29/152* (2013.01); *H01L 29/7843* (2013.01); *H01L 29/7849* (2013.01)

(56) References Cited

U.S. PATENT DOCUMENTS

| | | | |
|---|---|---|---|
| 5,357,119 | A | 10/1994 | Wang et al. |
| 5,683,934 | A | 11/1997 | Candelaria |
| 5,796,119 | A | 8/1998 | Seabaugh |
| 6,141,361 | A | 10/2000 | Mears et al. |
| 6,205,057 | B1 | 3/2001 | Pan |
| 6,376,337 | B1 | 4/2002 | Wang et al. |
| 6,472,685 | B2 | 10/2002 | Takagi |
| 6,741,624 | B2 | 5/2004 | Mears et al. |
| 6,830,964 | B1 | 12/2004 | Mears et al. |
| 6,833,294 | B1 | 12/2004 | Mears et al. |
| 6,878,576 | B1 | 4/2005 | Mears et al. |
| 6,891,188 | B2 | 5/2005 | Mears et al. |
| 6,897,472 | B2 | 5/2005 | Mears et al. |
| 6,927,413 | B2 | 8/2005 | Mears et al. |
| 6,952,018 | B2 | 10/2005 | Mears et al. |
| 6,958,486 | B2 | 10/2005 | Mears et al. |
| 6,993,222 | B2 | 1/2006 | Mears et al. |
| 7,018,900 | B2 | 3/2006 | Kreps |
| 7,033,437 | B2 | 4/2006 | Mears et al. |
| 7,034,329 | B2 | 4/2006 | Mears et al. |
| 7,045,377 | B2 | 5/2006 | Mears et al. |
| 7,045,813 | B2 | 5/2006 | Mears et al. |
| 7,071,119 | B2 | 7/2006 | Mears et al. |
| 7,105,895 | B2 | 9/2006 | Wang et al. |
| 7,109,052 | B2 | 9/2006 | Mears et al. |
| 7,123,792 | B1 | 10/2006 | Mears et al. |
| 7,148,712 | B1 | 12/2006 | Prey, Jr. et al. |
| 7,153,763 | B2 | 12/2006 | Hytha et al. |
| 7,202,494 | B2 | 4/2007 | Blanchard et al. |
| 7,227,174 | B2 | 6/2007 | Mears et al. |
| 7,229,902 | B2 | 6/2007 | Mears et al. |
| 7,239,163 | B1 | 7/2007 | Ralston-Good et al. |
| 7,265,002 | B2 | 9/2007 | Mears et al. |
| 7,279,699 | B2 | 10/2007 | Mears et al. |
| 7,279,701 | B2 | 10/2007 | Kreps |
| 7,288,457 | B2 | 10/2007 | Kreps |
| 7,303,948 | B2 | 12/2007 | Mears et al. |
| 7,432,524 | B2 | 10/2008 | Mears et al. |
| 7,435,988 | B2 | 10/2008 | Mears et al. |
| 7,436,026 | B2 | 10/2008 | Kreps |
| 7,446,002 | B2 | 11/2008 | Mears et al. |
| 7,446,334 | B2 | 11/2008 | Mears et al. |
| 7,491,587 | B2 | 2/2009 | Rao |
| 7,514,328 | B2 | 4/2009 | Rao |
| 7,517,702 | B2 | 4/2009 | Halilov et al. |
| 7,531,828 | B2 | 5/2009 | Mears et al. |
| 7,531,829 | B2 | 5/2009 | Blanchard |
| 7,531,850 | B2 | 5/2009 | Blanchard |
| 7,586,116 | B2 | 9/2009 | Kreps et al. |
| 7,586,165 | B2 | 9/2009 | Blanchard |
| 7,598,515 | B2 | 10/2009 | Mears et al. |
| 7,612,366 | B2 | 11/2009 | Mears et al. |
| 7,625,767 | B2 | 12/2009 | Huang et al. |
| 7,659,539 | B2 | 2/2010 | Kreps et al. |
| 7,700,447 | B2 | 4/2010 | Dukovski et al. |
| 7,718,996 | B2 | 5/2010 | Dukovski et al. |
| 7,781,827 | B2 | 8/2010 | Rao |
| 7,812,339 | B2 | 10/2010 | Mears et al. |
| 7,863,066 | B2 | 1/2011 | Mears et al. |
| 7,880,161 | B2 | 2/2011 | Mears et al. |
| 7,928,425 | B2 | 4/2011 | Rao |
| 8,389,974 | B2 | 3/2013 | Mears et al. |
| 9,275,996 | B2 | 3/2016 | Mears et al. |
| 9,406,753 | B2 | 8/2016 | Mears et al. |
| 9,558,939 | B1 | 1/2017 | Stephenson et al. |
| 2003/0034529 | A1 | 2/2003 | Fitzgerald et al. |
| 2003/0057416 | A1 | 3/2003 | Currie et al. |
| 2005/0110003 | A1 | 5/2005 | Kreps |
| 2006/0220118 | A1 | 10/2006 | Stephenson et al. |
| 2007/0012910 | A1 | 1/2007 | Mears et al. |
| 2007/0020833 | A1 | 1/2007 | Mears et al. |
| 2007/0216439 | A1 | 9/2007 | Taketoshi et al. |
| 2008/0012004 | A1 | 1/2008 | Huang et al. |
| 2008/0258134 | A1 | 10/2008 | Mears et al. |
| 2011/0215299 | A1 | 9/2011 | Rao |
| 2015/0144878 | A1 | 5/2015 | Mears et al. |
| 2015/0357414 | A1 | 12/2015 | Mears |
| 2016/0099317 | A1 | 4/2016 | Mears et al. |
| 2016/0149023 | A1 | 5/2016 | Mears et al. |
| 2016/0336406 | A1 | 11/2016 | Mears et al. |
| 2016/0336407 | A1 | 11/2016 | Mears et al. |
| 2016/0358773 | A1 | 12/2016 | Mears et al. |
| 2017/0294514 | A1 | 10/2017 | Mears |

OTHER PUBLICATIONS

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.
Novikov et al. "Silicon-based Optoelectronics" 1999-2003, pp. 1-6.
R. Tsu Phenomena in silicon nanostructure devices published online Sep. 6, 2000 by Applied Physics and Materials Science & Processing, pp. 391-402.
Raphael Tsu "Si Based Green ELD: Si-Oxygen Superlattice" wysiwyg://l/http://www3.interscience.wiley.com/cgi-bin/abstract/72512946/start: published online Jul. 21, 2000; 2 pgs. Abstract Only.
Xu et al. "Effectiveness of Quasi-confinemant technology for Improving P-chanel Si an Ge MOSSFET performance" Department of Electrical Engineering and Computer Science, University of California, Berkeley, 2012, pp. 2. mearslech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Xu et al., "MOSFET performance and scalability enhancement by insertion of oxygen layers", Department of Electrical Engineering and Computer Science, University of California, Berkeley, 2012, pp. 1-4.
U.S. Appl. No. 15/664,028; filed Jul. 31, 2017.
U.S. Appl. No. 15/592,464; filed May 11, 2017.
U.S. Appl. No. 15/633,918; filed Jun. 27, 2017.
U.S. Appl. No. 15/670,231; filed Aug. 7, 2017.
U.S. Appl. No. 15/670,240; filed Aug. 7, 2017.
U.S. Appl. No. 15/670,266; filed Aug. 7, 2017.
U.S. Appl. No. 15/670,274; filed Aug. 7, 2017.
U.S. Appl. No. 15/678,658; filed Aug. 16, 2017.

SEMICONDUCTOR DEVICE INCLUDING THRESHOLD VOLTAGE MEASUREMENT CIRCUITRY

CROSS-REFERENCE TO RELATED APPLICATIONS

The application claims the benefit of U.S. Provisional App. No. 62/375,978 filed Aug. 17, 2016, which is hereby incorporated herein in its entirety by reference.

TECHNICAL FIELD

The present disclosure generally relates to semiconductor devices, such as semiconductor memory devices, for example, and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an re-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A semiconductor device may include a substrate, active circuitry on the substrate and including a plurality of differential transistor pairs, and threshold voltage test circuitry on the substrate. The threshold voltage test circuitry may include a pair of differential test transistors replicating the differential transistor pairs within the active circuitry, with each test transistor having a respective input and output, and at least one gain stage configured to amplify a difference between the outputs of the differential test transistors for measuring a threshold voltage thereof. The plurality of differential transistor pairs and the pair of differential test transistors may each include spaced apart source and drain regions, a channel region extending between the source and drain regions, and a gate overlying the channel region. Each of the channel regions may include a superlattice, with the superlattice including a plurality of stacked groups of layers with each group of layers including a plurality of stacked base semiconductor monolayers defining a base semiconductor portion and at least one non-semiconductor monolayer thereon constrained within a crystal lattice of adjacent base semiconductor portions.

By way of example, the at least one gain stage may include a plurality of gain stages configured to successively amplify the difference between the outputs of the differential test transistors over an input voltage range. In one example implementation, the semiconductor substrate may be a semiconductor wafer, and the active circuitry may include a plurality of spaced apart active circuitry areas separated by scribe lines, with the threshold voltage test circuity positioned within at least one of the scribe lines.

In accordance with one example, the active circuitry may include at least one memory cell array. Moreover, the at least one gain stage may include a sense amplifier coupled to first conduction terminals of the pair of differential test transistors, and a current source coupled to second conduction terminals of the pair of differential test transistors. The pair of differential test transistors may be a pair of NMOS differential test transistors, or a pair of PMOS differential test transistors.

By way of example, each base semiconductor portion may include silicon and/or germanium. Furthermore, the at least one non-semiconductor monolayer may include a non-semiconductor selected from the group consisting of oxygen, nitrogen, fluorine, and carbon-oxygen, for example. Furthermore, at least some semiconductor atoms from opposing base semiconductor portions of each superlattice may be chemically bound together through the non-semiconductor layer therebetween.

DETAILED DESCRIPTION

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

By way of background, one important requirement for DRAM (Dynamic Random Access Memory) devices is the ability to hold data in an inactive state with the minimum power drain. This power drain comes from the need to refresh the data stored in bit cells in selected portions of the memory, as well as leakage in the rest of the periphery. This specification is referred to as IDD6. This directly affects the usable time from a battery charge for smart phones, laptops, etc. Another important parameter for DRAM devices is latency. Latency is the delay between selecting a random location within the memory device and the arrival of the selected data on the outputs.

MST technology for CMOS devices from Atomera Technologies, Inc. (which will be discussed further below with respect to FIGS. 13-17C) has the capability to operate with significant overdrive voltage compared to standard CMOS devices. As a result, the performance of MST-based devices is up to 70% higher than standard CMOS technology, which may translate into a 70% reduction in latency. An example approach for integrating MST technology in CMOS devices is set forth in U.S. Pat. No. 6,878,576 to Mears et al., which is hereby incorporated herein in its entirety by reference.

A further characteristic of MST technology is that it allows for very precise threshold voltage (Vt) adjustment as a result of its dopant confinement abilities, as discussed further in U.S. Pat. Pub. No. 2006/0220118, for example, which is hereby incorporated herein in its entirety by reference. As a result, using MST technology, CMOS circuitry may be fabricated in which high Vt and low Vt devices are each optimized separately on the same chip. By optimizing the high Vt devices for minimal leakage, they may be used as headers for reducing leakage in the rest of the periphery during standby mode, while allowing optimization of the low Vt devices in these paths to be even faster than the 70% improvement referred to above during active mode.

The present disclosure relates to offset measurement structures and techniques which may be used to quantify the enhanced Vt performance of CMOS devices incorporating MST technology, such as DRAM devices, for example. It should be noted that the offset measurement structures and techniques set forth herein may also be used with other devices as well which do not include MST technology in some embodiments.

Figure 13:
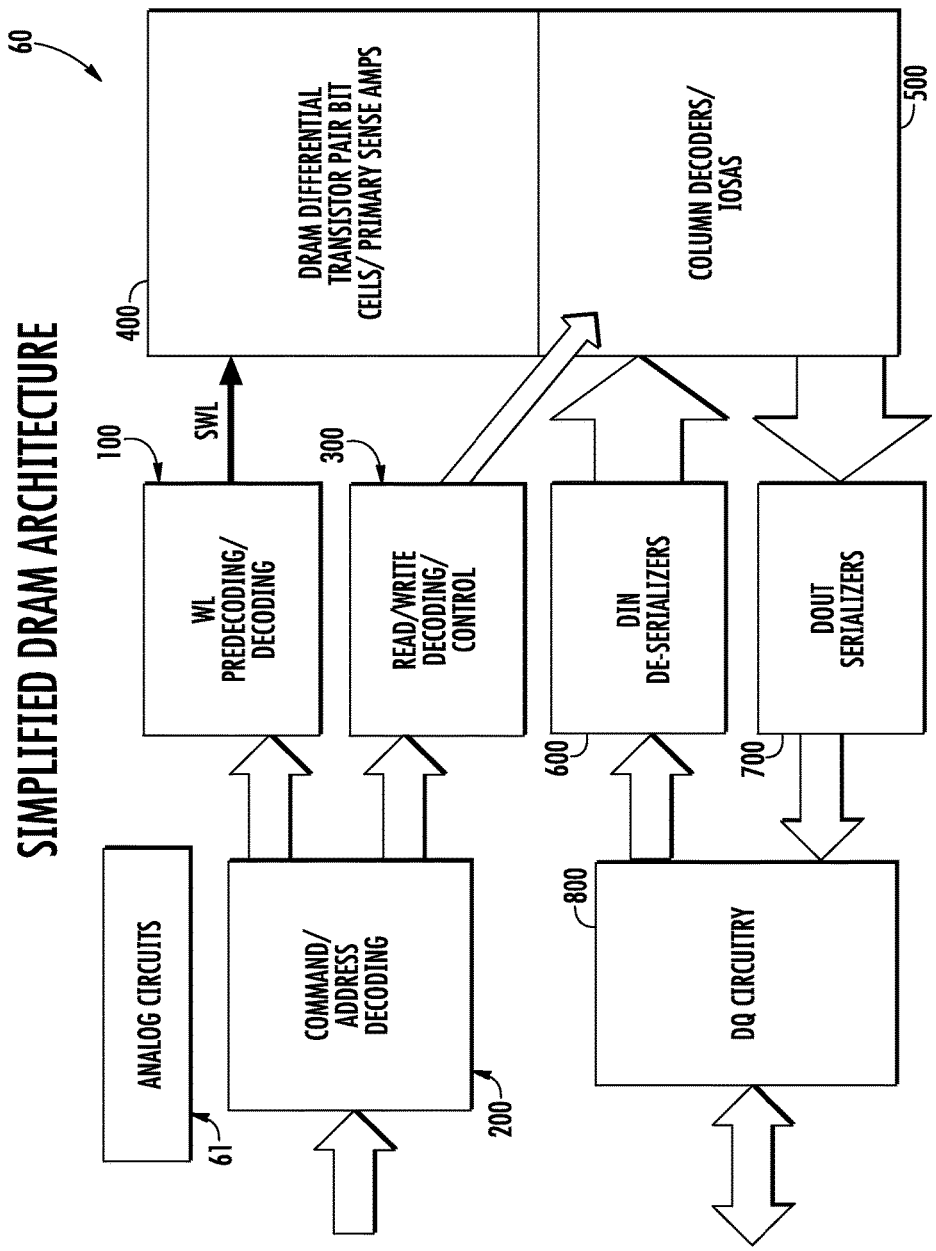
FIG. 13 is a schematic block diagram of a DRAM architecture in which example offset measurement circuits may be implemented.

Referring initially to FIG. 13, a typical DRAM architecture 60 is first described by way of background. Inputs come into the chip on the left side, into command/address decoding block 200. This represents the logic for decoding address information for the selected cells as well as control information to determine the type of operation to be performed. Part of this information is fed into the word line pre-decoding and decoding circuitry 100, otherwise known as row activation circuitry. The other part of this information is fed into read/write decoding and control block 300. The terms read and write refer to column operations only to previously activated rows. This circuitry is not operated during refresh-only operations, where the data is not read to or written from the outside world. During read and write operations, the outputs of this circuitry are fed into block column decoders and secondary sense amps (IOSAs) 500, which interface directly to the memory array 400, which includes all of bit cells and primary sense amps. More particularly, the bit cells include respective differential transistor pairs, as will be discussed further below.

Word line pre-decoding and decoding circuitry block 100 also interfaces directly to the bit cells in the memory array 400. Block 500 also interfaces directly with the data in and data out blocks 600 and 700. Frequently, the internal bus width of the DRAM is much wider than the external interfaces, so the data in and data out paths include serialization (for data out) and de-serialization (for data in). Finally, the data in and data out paths are combined at the bidirectional DQ circuitry 800, which interfaces with the outside world. The DRAM architecture 60 further illustratively includes associated analog circuits 61, as will be appreciated by those skilled in the art.

Figure 18:
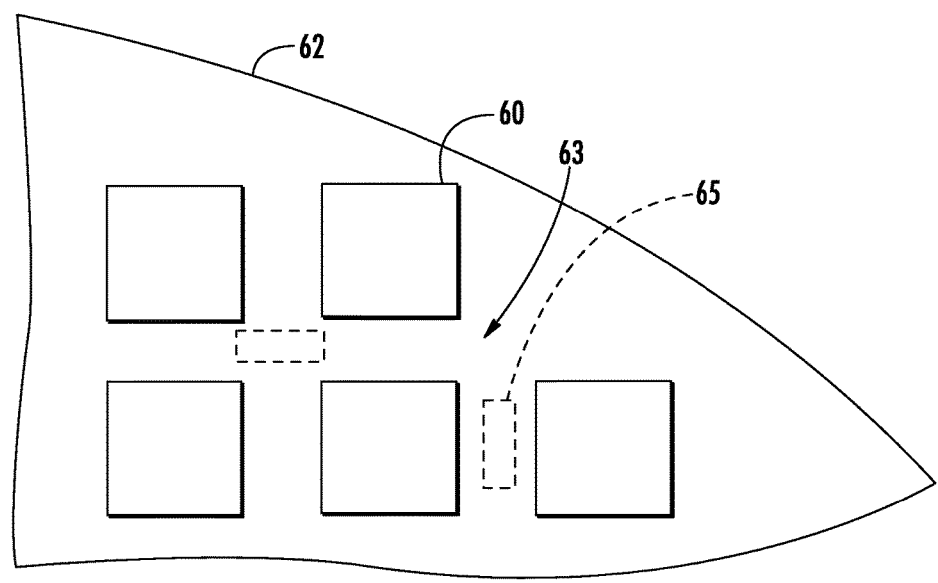
FIG. 18 is a top view of a portion of a semiconductor wafer including offset measurement circuitry in accordance with an example embodiment.

The present disclosure relates to offset measurement structures which may be used, for example, to measure Vt associated with the memory cell and sense amp structures 400 incorporating MST technology, for example. Generally speaking, the offset measurement structure includes a plurality of stages, and provides for both linear and saturation measurements. By way of example, in one example configuration one or more sets of Vt measurement circuitry 65 may be formed in the scribe lines 63 of a semiconductor wafer 62 between active circuitry (e.g., memory) components 60 (FIG. 18) and used for testing purposes prior to cutting of the wafer into separate dies, as will be appreciated by those skilled in the art.

Figure 1:
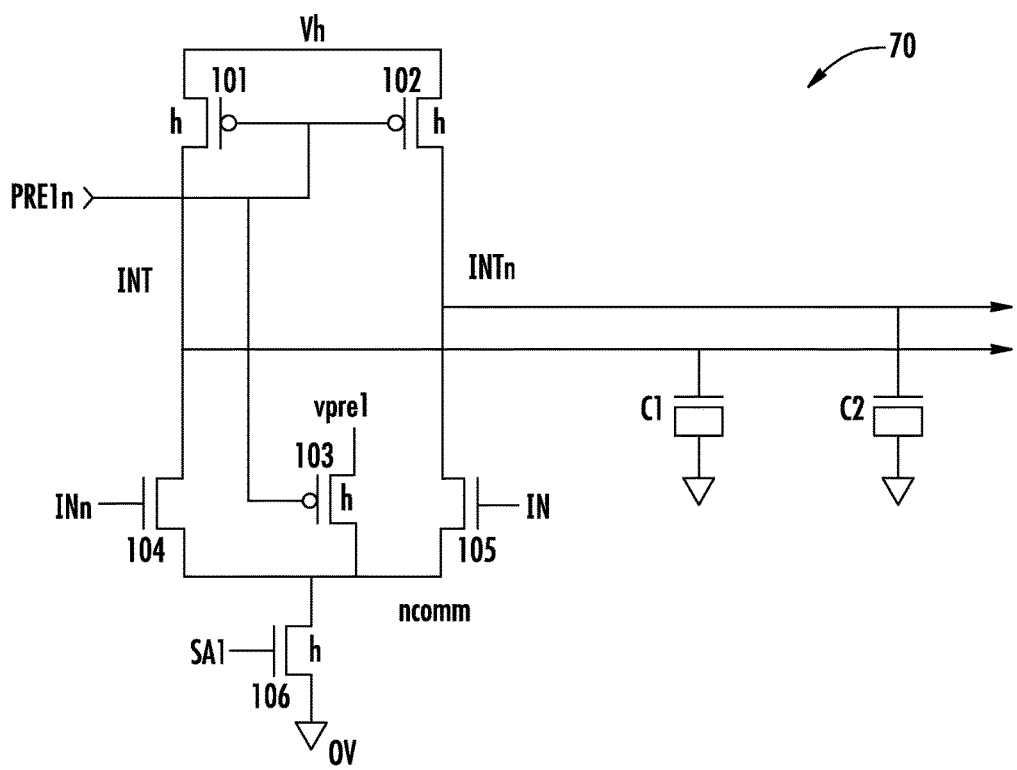
FIG. 1 is a schematic diagram of a first stage of an NMOS offset measurement circuit in accordance with an example embodiment.
Figure 2:
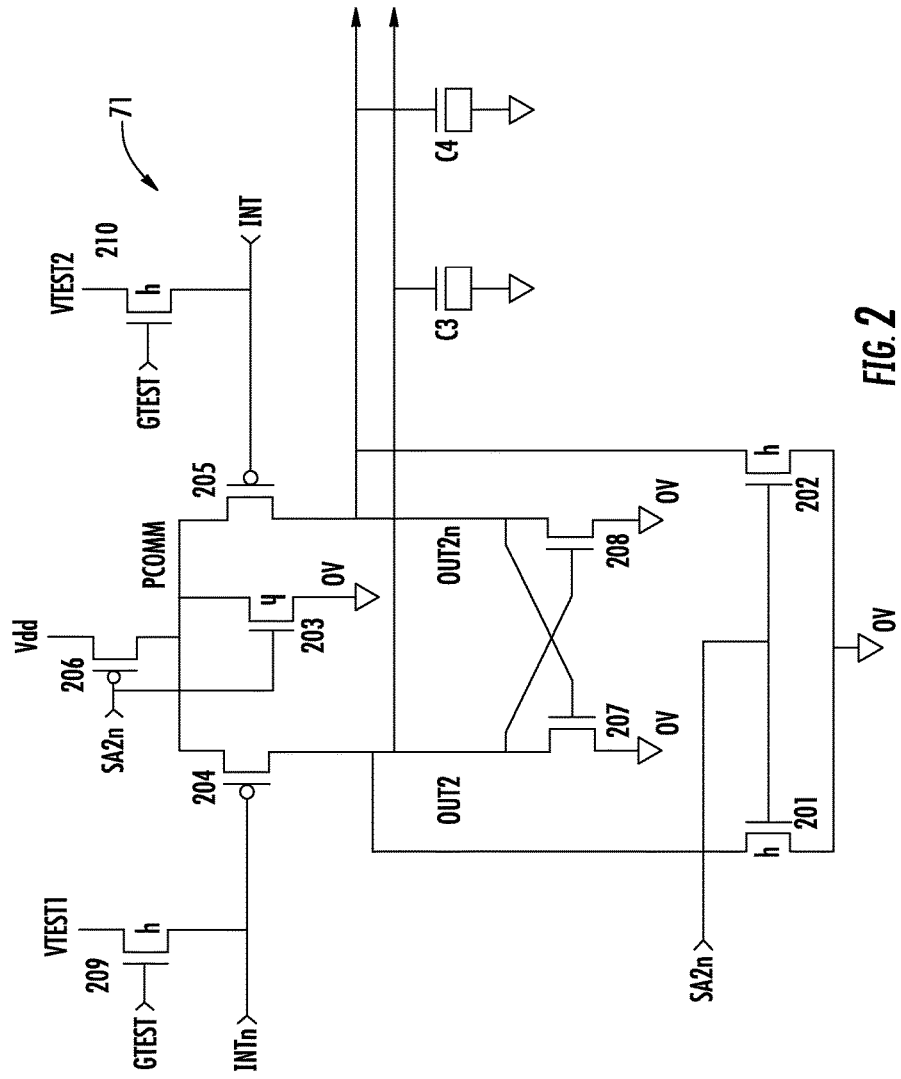
FIG. 2 is a schematic diagram of a second stage of the NMOS offset measurement circuit in accordance with an example embodiment.
Figure 3:
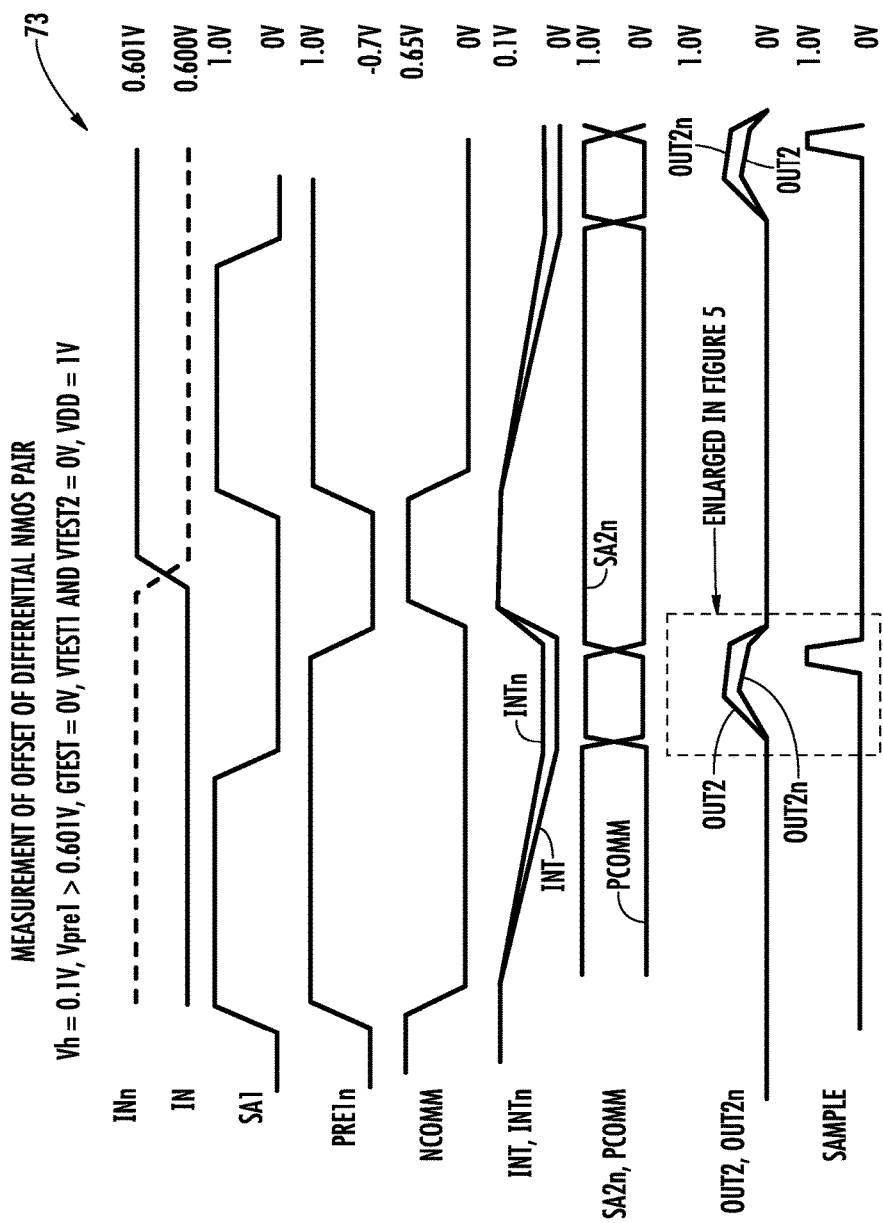
FIG. 3 is a signal diagram associated with the stages of FIGS. 1, 2, and 4.
Figure 4:
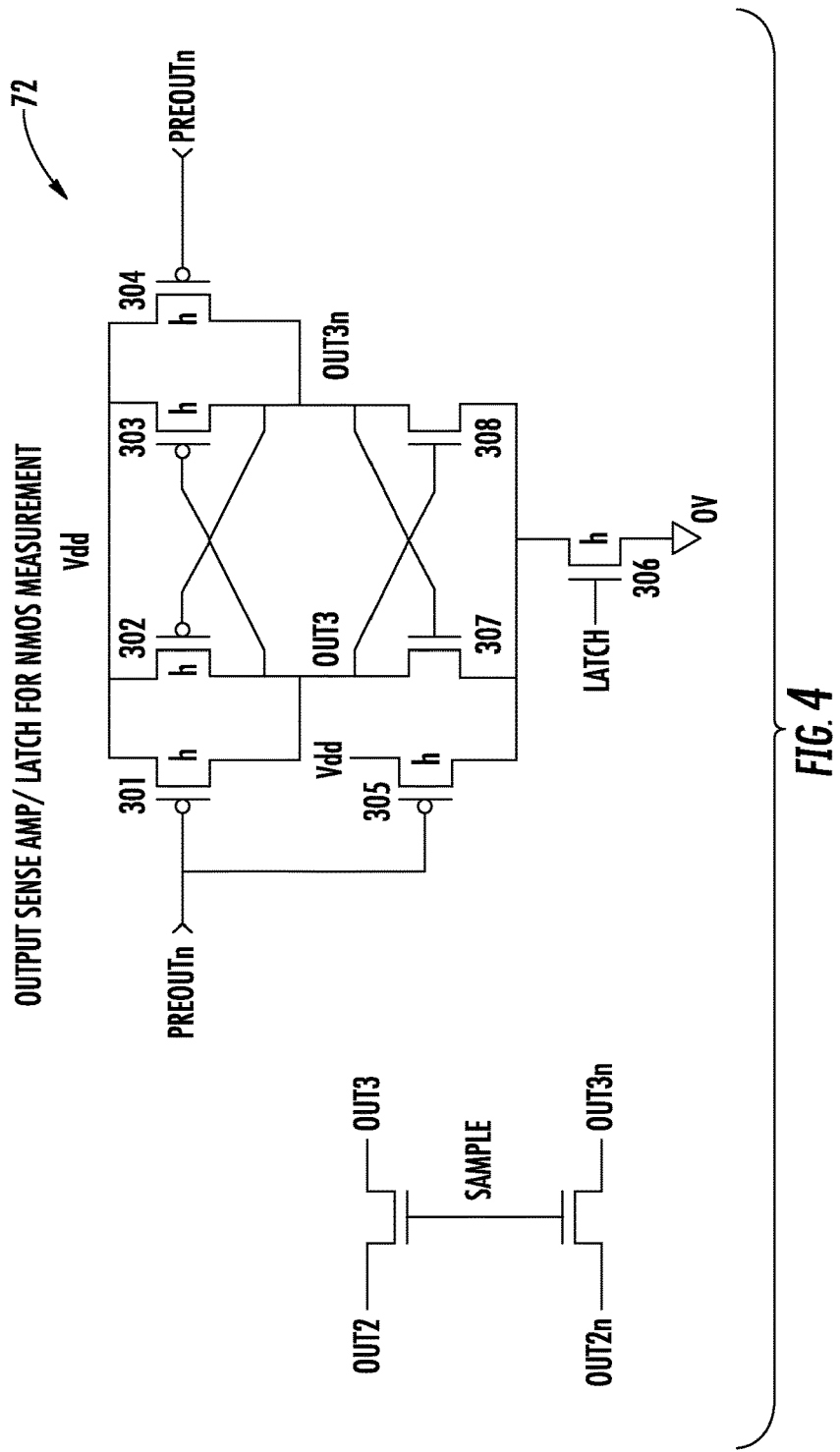
FIG. 4 is a schematic diagram of an output sense amp/latch (third stage) of the NMOS measurement circuit in accordance with an example embodiment.

An example embodiment of Vt test circuitry 65 for NMOS measurement is shown in FIGS. 1-6. More particularly, in this embodiment there are three stages 70, 71, 72 (shown in FIGS. 1, 2, and 4) which are used to measure a voltage difference between NMOS transistors 104, 105 in a linear mode to thereby provide the threshold voltage (Vt) of these transistors. More particularly, the NMOS transistors 104, 105 are laid out to resemble the actual DRAM transistors in the memory cell array 400. The first stage 70 further illustratively includes transistors 101, 102, 103, 106, and capacitors C1, C2 which are connected as shown in FIG. 1. The transistor 106 is configured as a sense amplifier coupled to first conduction terminals of the transistors 104, 105, and the transistors 101, 102 define a current generator coupled to second conduction terminals of the transistors 104, 105. The second stage 71 illustratively includes transistors 201-210 and capacitors C3, C4 which are connected as shown in FIG. 2. Moreover, the third stage 72 defines an output sense amp/latch and illustratively includes transistors 301-308 connected as shown in FIG. 3.

Figure 5:
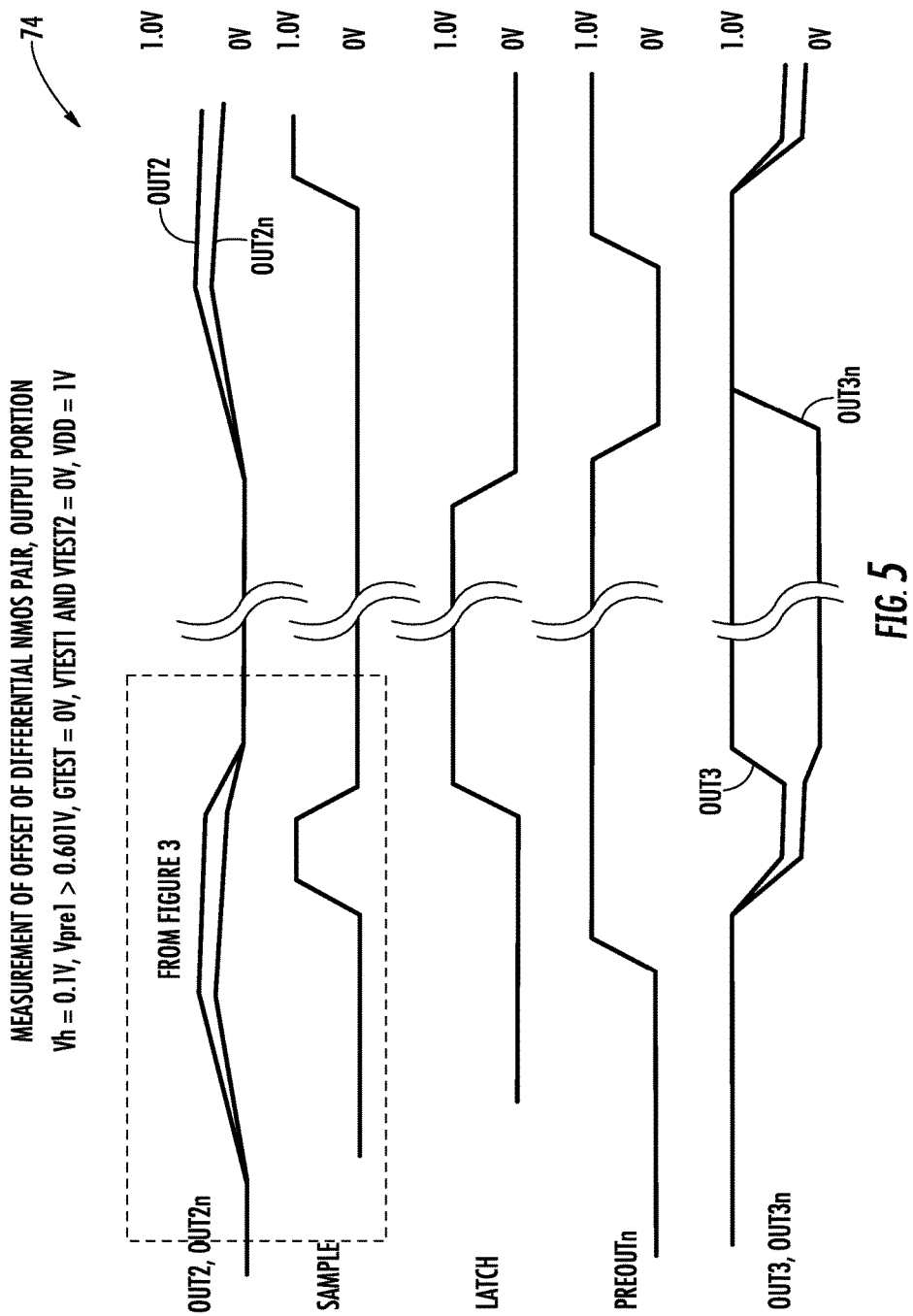
FIGS. 5 and 6 are further signal diagrams associated with the stages of FIGS. 1, 2, and 4.
Figure 6:
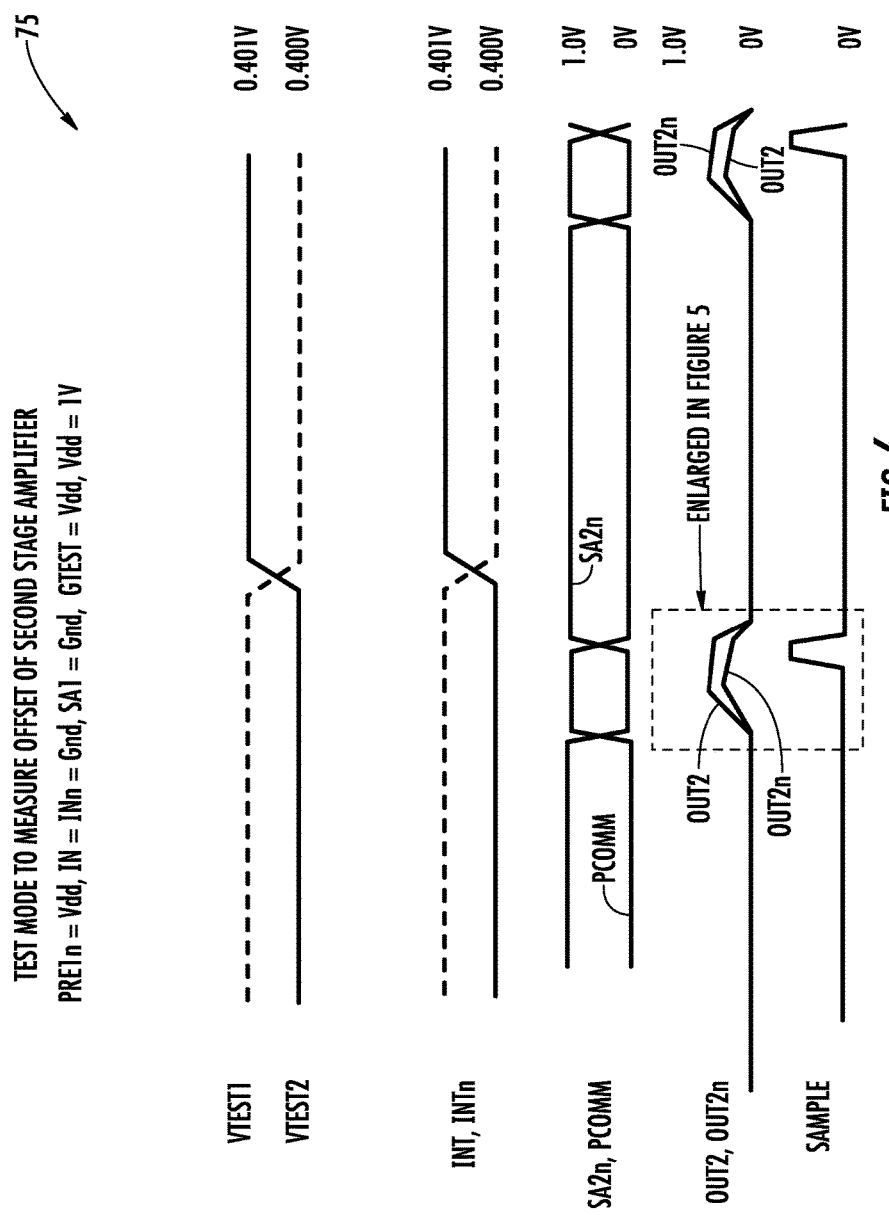

The input and output signals for the three stages 70-72 are shown in the signal diagrams 73-75 of FIGS. 3, 5, and 6, respectively. As will be appreciated by the skilled artisan, the difference or offset between the signals IN, INTn are successively amplified over the three stages 70-72 to provide a measureable or detectable Vt for the transistors 104, 105. Since the transistors 104, 105 are configured the same as, or replicate, the differential transistor pairs within the memory array 400, the Vt test circuitry accordingly provides the Vt for the active memory cells. This may accordingly allow for validation of Vt levels for different design configurations, as well as to ensure that there are no problems with the manufacturing process (i.e., as a check on quality control).

Figure 7:
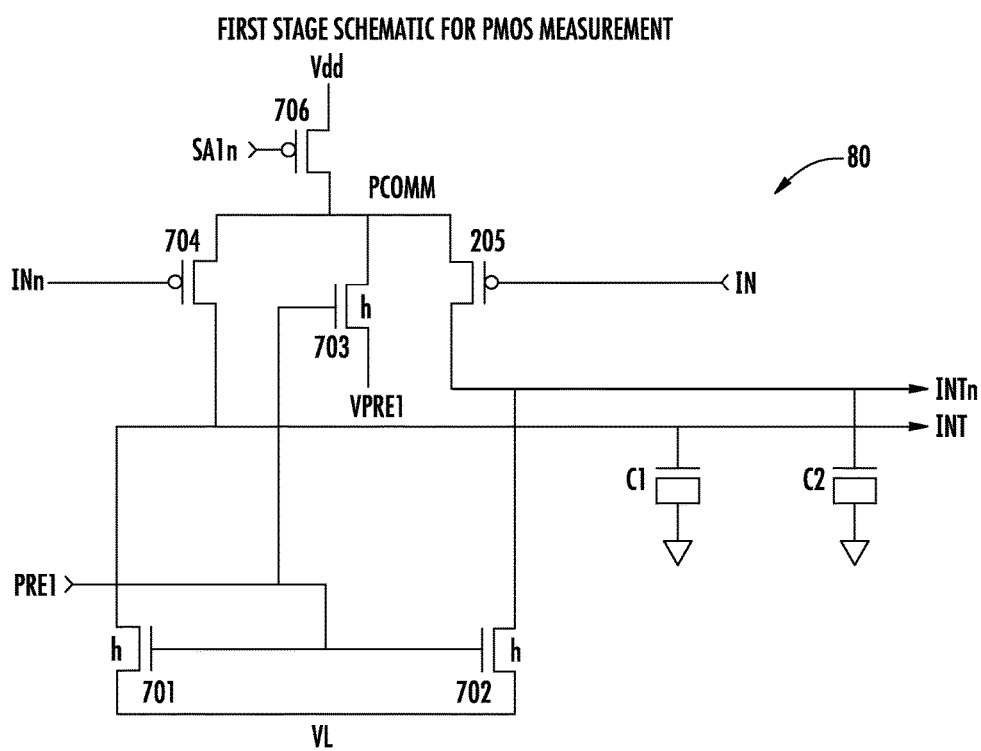
FIG. 7 is a schematic diagram of a first stage of a PMOS offset measurement circuit in accordance with an example embodiment.
Figure 8:
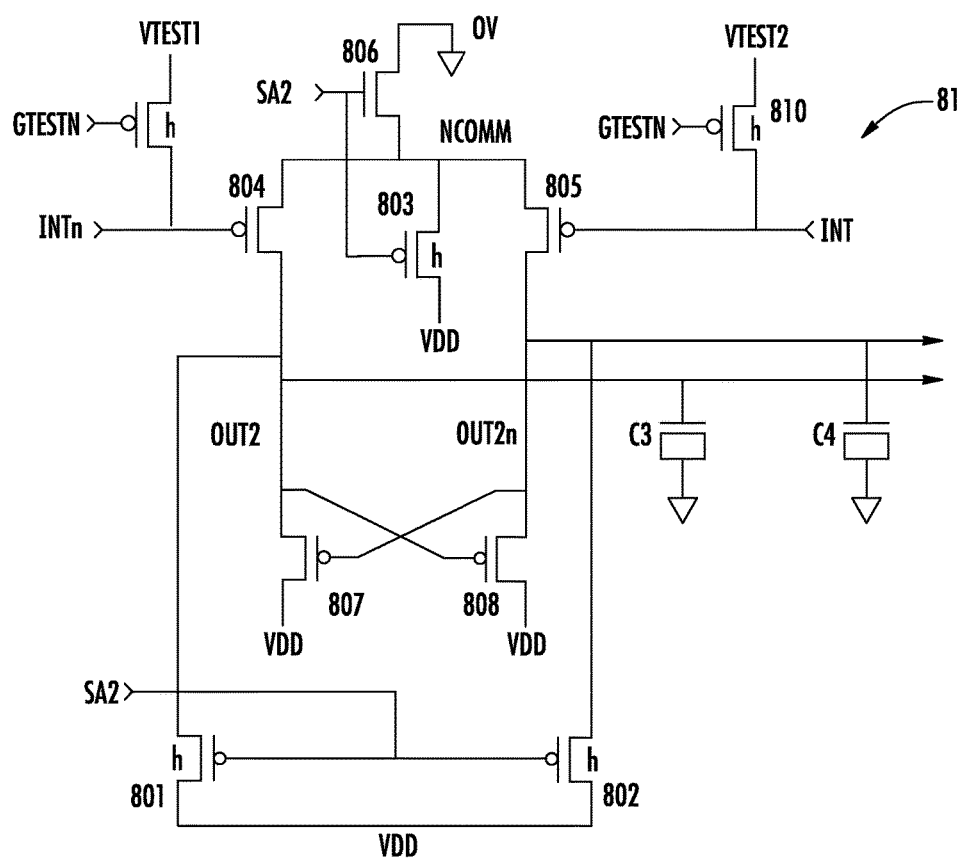
FIG. 8 is a schematic diagram of a second stage of the PMOS offset measurement circuit in accordance with an example embodiment.
Figure 9:
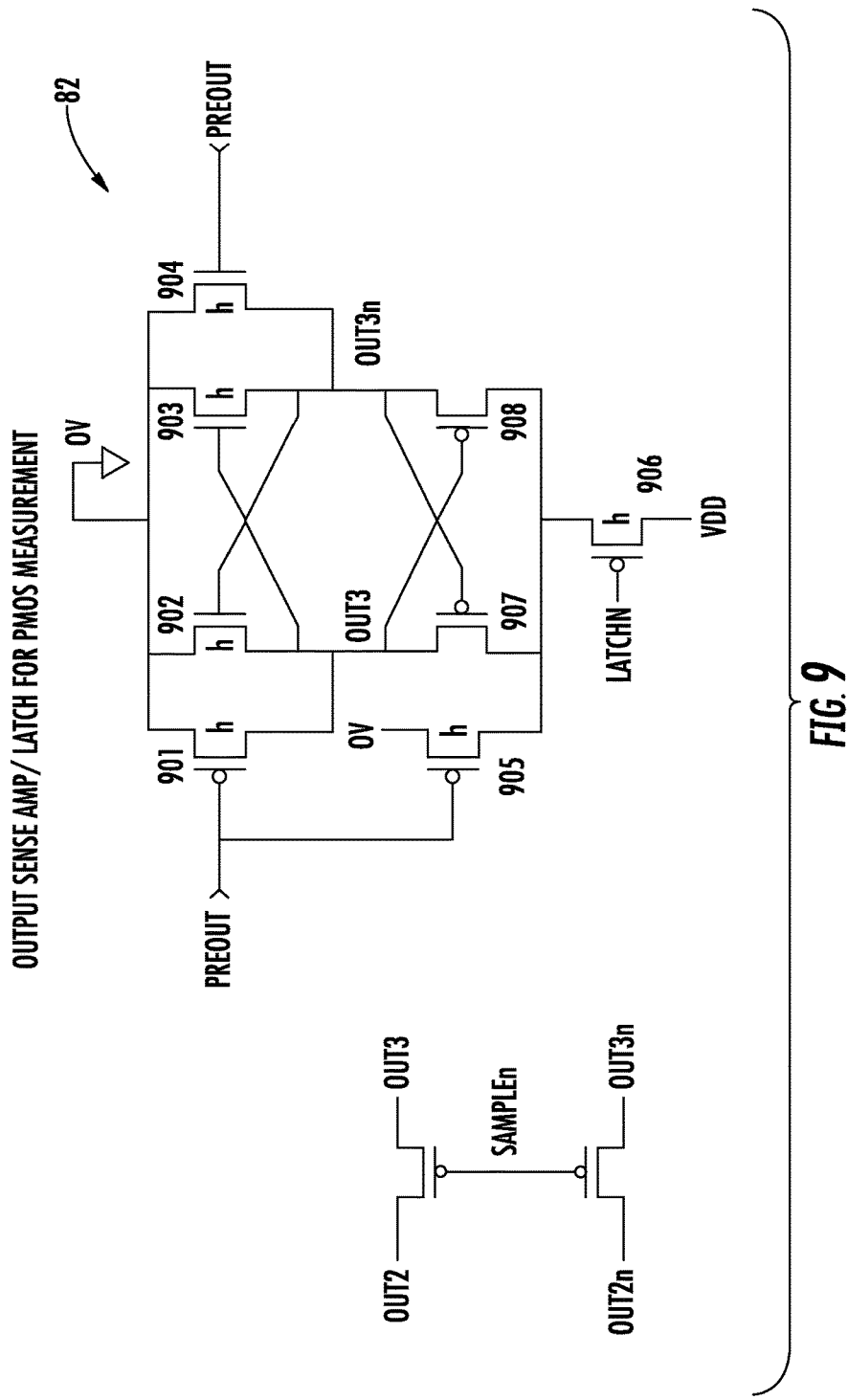
FIG. 9 is a schematic diagram of an output sense amp/latch (third stage) of the PMOS measurement circuit in accordance with an example embodiment.
Figure 10:
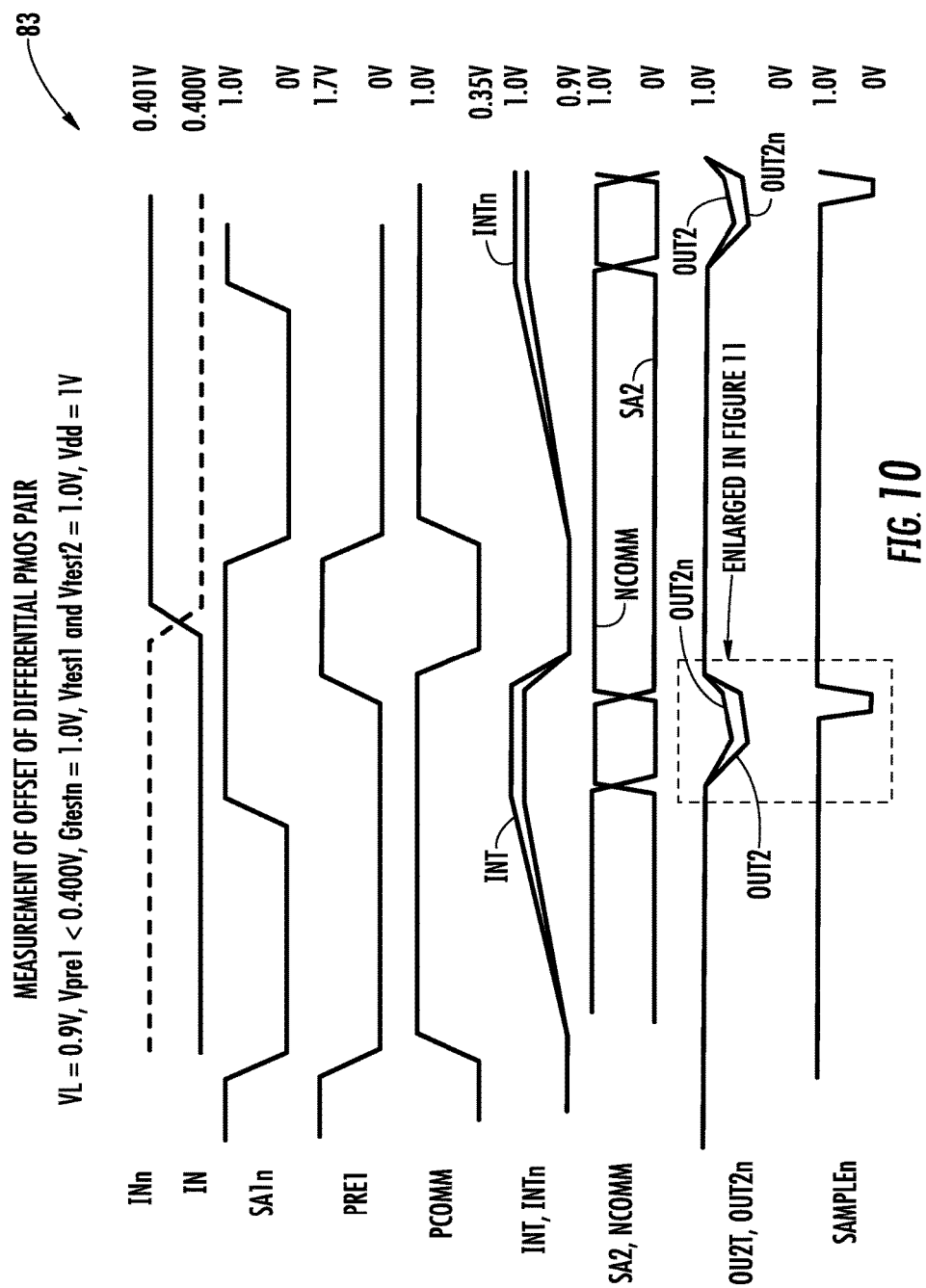
FIGS. 10-12 are signal diagrams associated with the stages of FIGS. 7-9.
Figure 11:
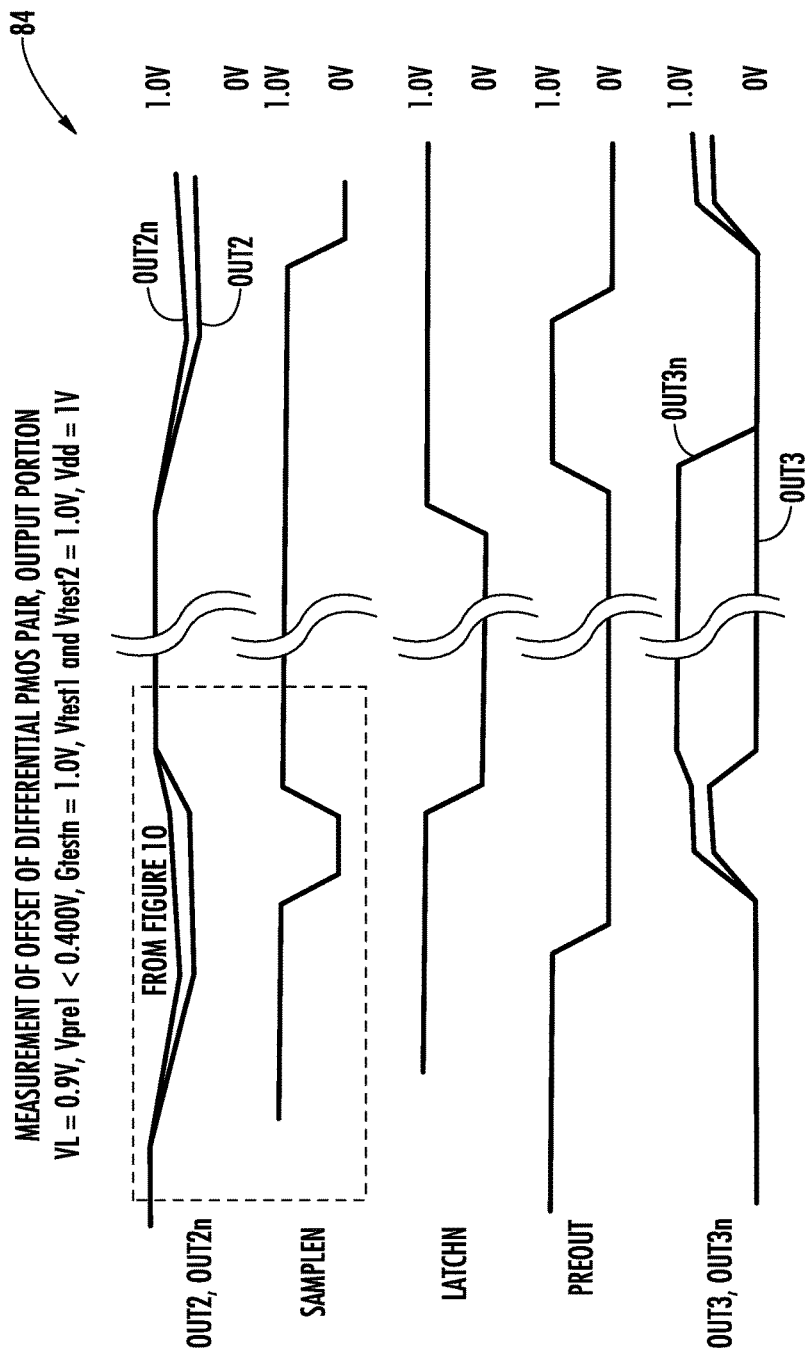
Figure 12:
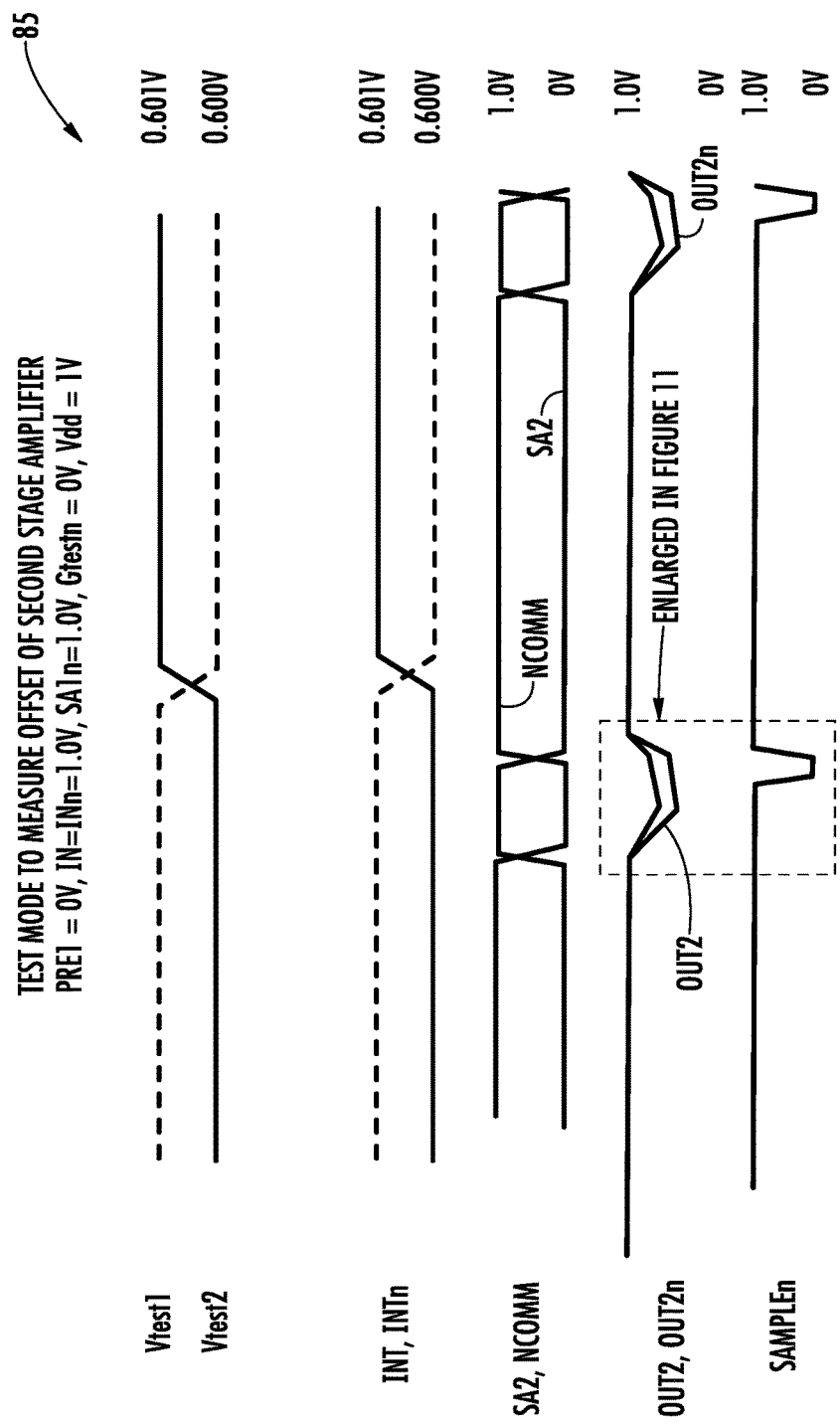

The related Vt test circuitry configuration for PMOS measurement is shown in FIGS. 7-12. Here again there are three stages 80, 81, 82 (shown in FIGS. 7-9) which are used to measure a voltage difference between PMOS transistors 704, 705. As before, the PMOS transistors 704, 705 are laid out to resemble or replicate the actual PMOS DRAM transistors in the memory devices of the array 400. The first stage 80 further illustratively includes transistors 701-703, 706, and capacitors C1, C2 which are connected as shown in FIG. 7. The second stage 81 illustratively includes transistors 801-810 and capacitors C3, C4 which are connected as shown in FIG. 8. Moreover, the third stage 82 defines an output sense amp/latch and illustratively includes transistors 901-908 which are connected as shown in FIG. 9. The input and output signals for the three stages are shown in the signal diagrams 83-85 of FIGS. 10-12.

The above-described configurations advantageously provide the ability to apply several high precision voltage sources, while cancelling out the offset of the second stages dynamically.

A related method may include forming a semiconductor device (e.g., the DRAM architecture 60) by forming at least one active circuitry array 400 on a substrate or wafer 62, and forming threshold voltage test circuitry 65 on the substrate, as described above. The method may further include causing the gains stages 70-72 to amplify a difference between the outputs of the differential test transistors 104, 105, and measuring a threshold voltage of the differential test transistors based upon the amplified difference between the outputs.

A description of the above-noted MST technology which may be used in DRAM memory cells in accordance with the present application is now provided. Generally speaking, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 14:
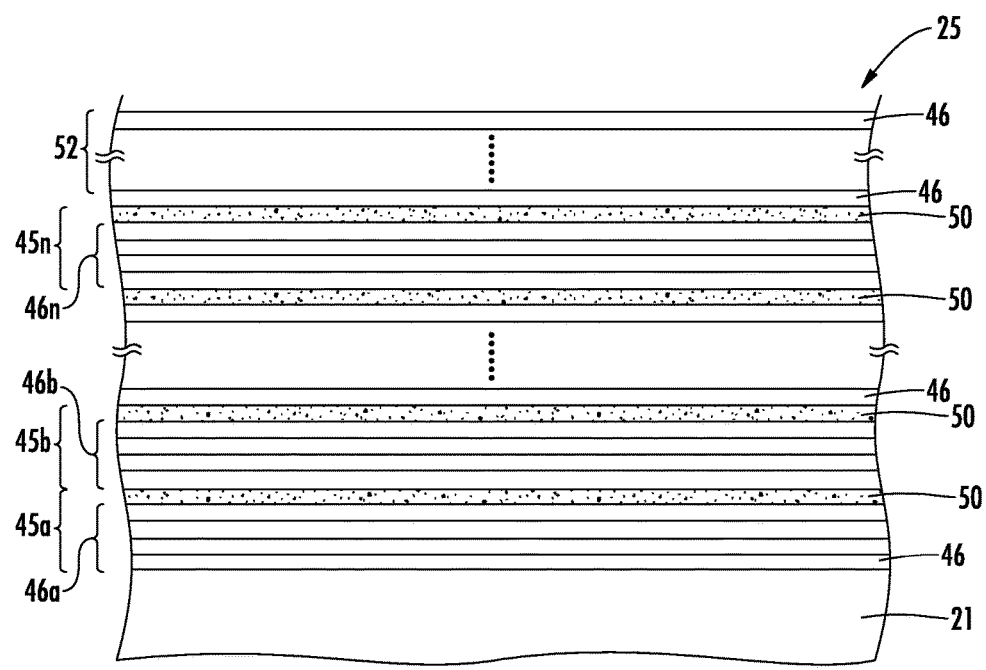
FIG. 14 is a greatly enlarged schematic cross-sectional view of a superlattice for use in a semiconductor device in accordance with an example embodiment.
Figure 15:
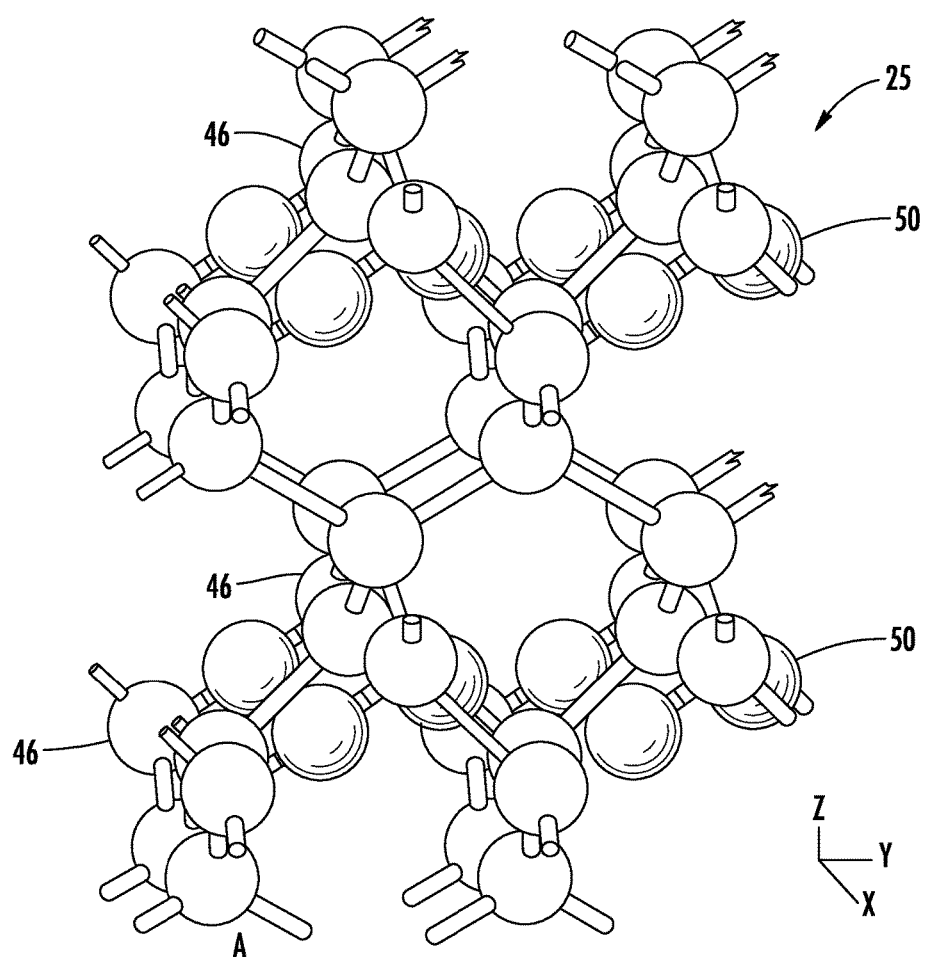
FIG. 15 is a perspective schematic atomic diagram of a portion of the superlattice shown in FIG. 14.

Referring now to FIGS. 14 and 15, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 11.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 11 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 15. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 15, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 14 and 15, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 16:
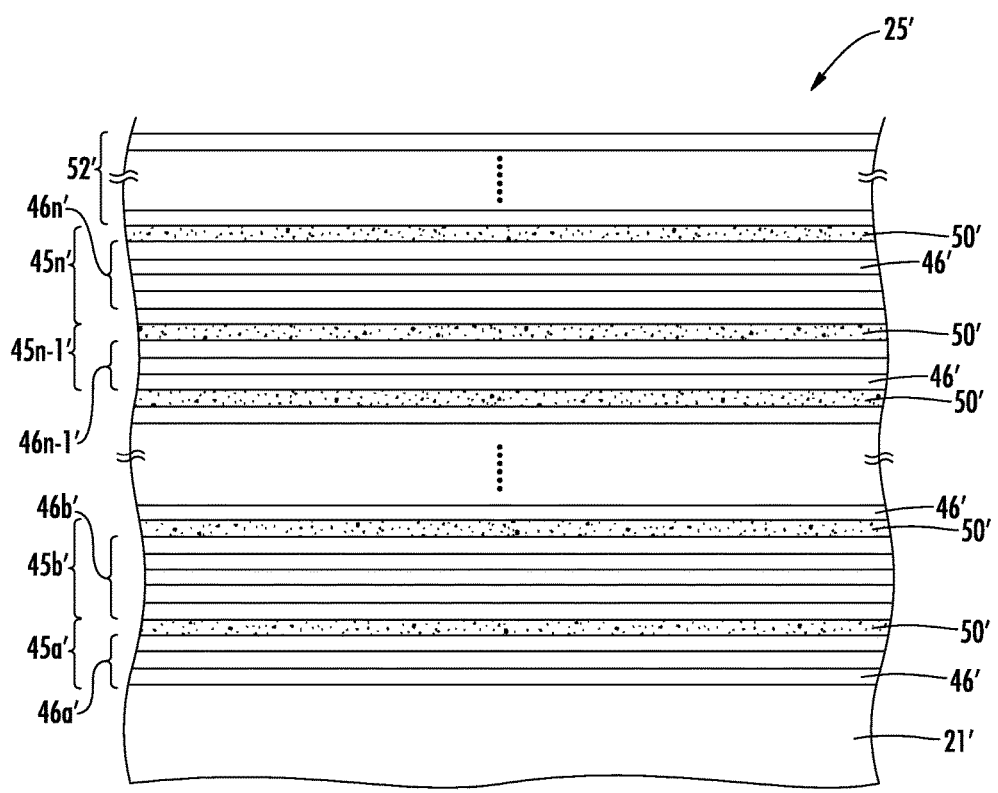
FIG. 16 is a greatly enlarged schematic cross-sectional view of another embodiment of a superlattice in accordance with an example embodiment.

Indeed, referring now additionally to FIG. 16, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 16 not specifically mentioned are similar to those discussed above with reference to FIG. 14 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 17A:
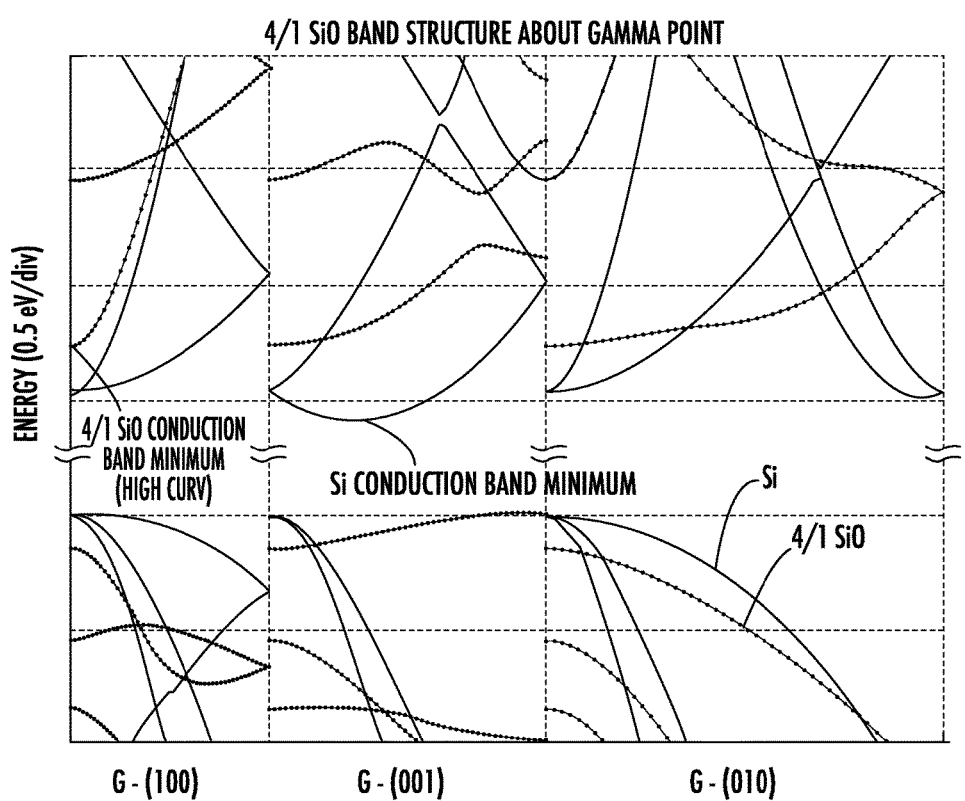
FIG. 17A is a graph of the calculated band structure from the gamma point (G) for both bulk silicon as in the prior art, and for the 4/1 Si/O superlattice as shown in FIGS. 14-15.
Figure 17B:
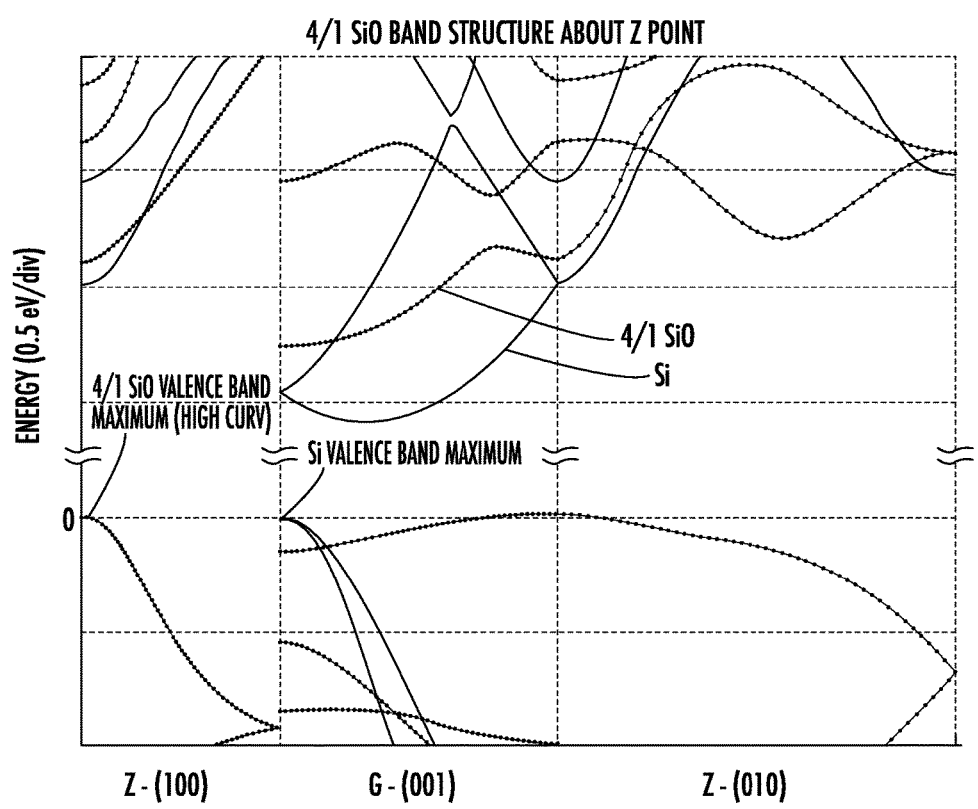
FIG. 17B is a graph of the calculated band structure from the Z point for both bulk silicon as in the prior art, and for the 4/1 Si/O superlattice as shown in FIGS. 14-15.
Figure 17C:
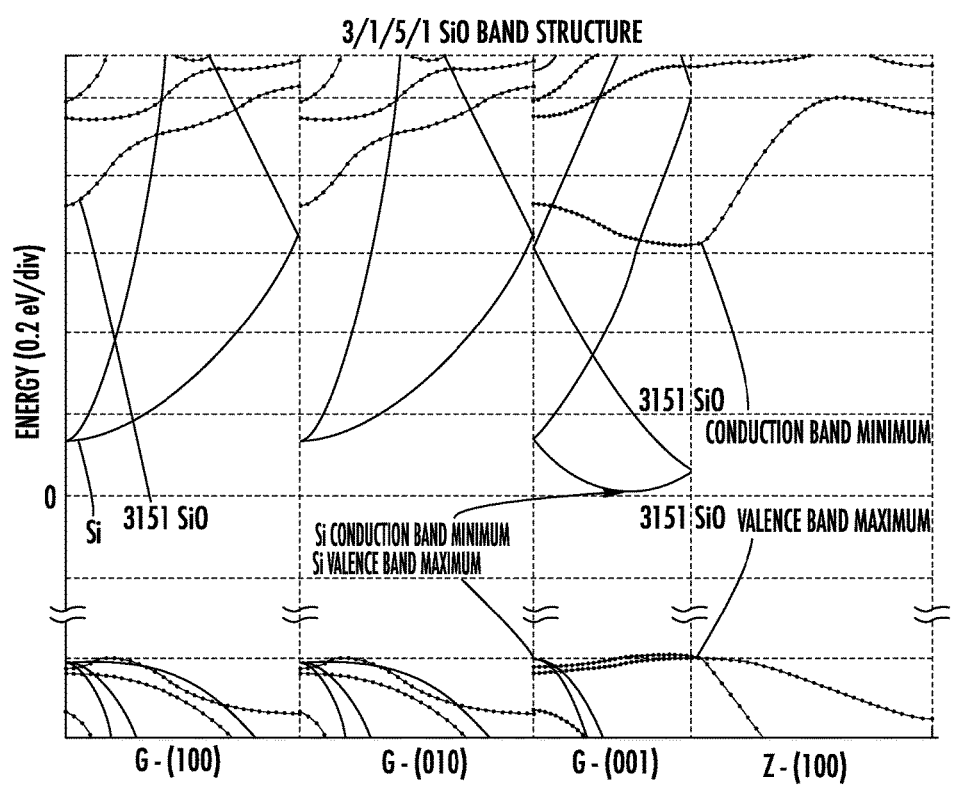
FIG. 17C is a graph of the calculated band structure from both the gamma and Z points for both bulk silicon as in the prior art, and for the 5/1/3/1 Si/O superlattice as shown in FIG. 16.

In FIGS. 17A-17C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 17A shows the calculated band structure from the gamma point (G) for both bulk silicon (represented by continuous lines) and for the 4/1 Si/O superlattice 25 shown in FIG. 14 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 17B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 17C shows the calculated band structure from both the gamma and Z point for both bulk silicon (continuous lines) and for the 5/1/3/1 Si/O structure of the superlattice 25' of FIG. 16 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Further details regarding the implementation of MST technology in a semiconductor memory device may be found in U.S. Pat. No. 7,659,539 to Kreps et al., which is hereby incorporated herein in its entirety by reference.

Figure 19:
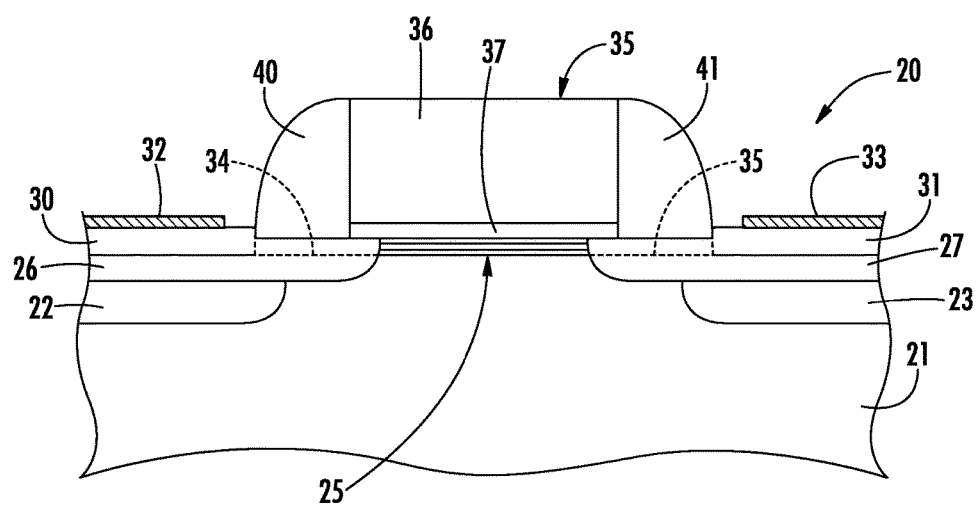
FIG. 19 is a cross-sectional diagram of a MOS transistor including a superlattice which may be used in the circuits of FIGS. 1, 2, and 4.

An example MOSFET 20 which incorporates the superlattice 25 for a channel region thereof, and which may be used for the above-described differential transistor pairs, is now described with reference to FIG. 19. The illustrated MOSFET 20 includes a substrate 21, source/drain regions 22, 23, source/drain extensions 26, 27, and a channel region therebetween provided by the superlattice 25. Source/drain silicide layers 30, 31 and source/drain contacts 32, 33 overlie the source/drain regions as will be appreciated by those skilled in the art. Regions indicated by dashed lines 34, 35 are optional vestigial portions formed originally with the superlattice, but thereafter heavily doped. In other embodiments, these vestigial superlattice regions 34, 35 may not be present as will also be appreciated by those skilled in the art. A gate 35 illustratively includes a gate insulating layer 37 adjacent the channel provided by the superlattice 25, and a gate electrode layer 36 on the gate insulating layer. Sidewall spacers 40, 41 are also provided in the illustrated MOSFET 20.

This application is related to copending patent application entitled, "METHOD FOR MAKING A SEMICONDUCTOR DEVICE INCLUDING THRESHOLD VOLTAGE MEASUREMENT CIRCUITRY," U.S. Publication No. 2018/0052205, published Feb. 22, 2018, and is hereby incorporated herein in its entirety by reference.

Many modifications and other embodiments will come to the mind of one skilled in the art having the benefit of the teachings presented in the foregoing descriptions and the associated drawings. Therefore, it is understood that such modifications and embodiments are intended to be included within the scope of the appended claims.

That which is claimed is:

1. A semiconductor device comprising:
a substrate;
active circuitry on the substrate and comprising a plurality of differential transistor pairs; and
threshold voltage test circuitry on the substrate and comprising
a pair of differential test transistors replicating the differential transistor pairs within the active circuitry, each test transistor having a respective input and output, and
at least one gain stage configured to amplify a difference between the outputs of the differential test transistors for measuring a threshold voltage thereof;
wherein the plurality of differential transistor pairs and the pair of differential test transistors each comprises spaced apart source and drain regions, a channel region extending between the source and drain regions, and a gate overlying the channel region;
wherein each of the channel regions comprises a superlattice, the superlattice comprising a plurality of stacked groups of layers with each group of layers comprising a plurality of stacked base semiconductor monolayers defining a base semiconductor portion and at least one non-semiconductor monolayer thereon constrained within a crystal lattice of adjacent base semiconductor portions.

2. The semiconductor device of claim 1 wherein the at least one gain stage comprises a plurality of gain stages configured to successively amplify the difference between the outputs of the differential test transistors over an input voltage range.

3. The semiconductor device of claim 1 wherein the semiconductor substrate comprises a semiconductor wafer; wherein the active circuitry comprises a plurality of spaced apart active circuitry areas separated by scribe lines; and wherein the threshold voltage test circuitry is positioned within at least one of the scribe lines.

4. The semiconductor device of claim 1 wherein the active circuitry comprises at least one memory cell array.

5. The semiconductor device of claim 1 wherein the at least one gain stage comprises a sense amplifier coupled to first conduction terminals of the pair of differential test transistors, and a current source coupled to second conduction terminals of the pair of differential test transistors.

6. The semiconductor device of claim 1 wherein the pair of differential test transistors comprises a pair of NMOS differential test transistors.

7. The semiconductor device of claim 1 wherein the pair of differential test transistors comprises a pair of PMOS differential test transistors.

8. The semiconductor device of claim 1 wherein each base semiconductor portion comprises silicon.

9. The semiconductor device of claim 1 wherein each base semiconductor portion comprises germanium.

10. The semiconductor device of claim 1 wherein the at least one non-semiconductor monolayer comprises a non-semiconductor selected from the group consisting of oxygen, nitrogen, fluorine, and carbon-oxygen.

11. The semiconductor device of claim 1 wherein at least some semiconductor atoms from opposing base semiconductor portions of each superlattice layer are chemically bound together through the non-semiconductor layer therebetween.

12. A semiconductor device comprising:
a semiconductor wafer;
a plurality of active circuitry areas spaced apart on the semiconductor wafer by scribe lines therebetween, each active circuitry area comprising a plurality of differential transistor pairs; and
threshold voltage test circuitry on the substrate within at least one of the scribe lines and comprising
a pair of differential test transistors replicating the differential transistor pairs within the active circuitry, each test transistor having a respective input and output, and
a plurality of gain stages configured to successively amplify the difference between the outputs of the differential test transistors over an input voltage range for measuring a threshold voltage thereof;
wherein the plurality of differential transistor pairs and the pair of differential test transistors each comprises spaced apart source and drain regions, a channel region extending between the source and drain regions, and a gate overlying the channel region;
wherein each of the channel regions comprises a superlattice, the superlattice comprising a plurality of stacked groups of layers with each group of layers comprising a plurality of stacked base semiconductor monolayers defining a base semiconductor portion and at least one non-semiconductor monolayer thereon constrained within a crystal lattice of adjacent base semiconductor portions.

13. The semiconductor device of claim 12 wherein each active circuitry area comprises a memory cell array.

14. The semiconductor device of claim 12 wherein a first one of the plurality of gain stages comprises a sense amplifier coupled to first conduction terminals of the pair of differential test transistors, and a current source coupled to second conduction terminals of the pair of differential test transistors.

15. The semiconductor device of claim 12 wherein the pair of differential test transistors comprises a pair of NMOS differential test transistors.

16. The semiconductor device of claim 12 wherein the pair of differential test transistors comprises a pair of PMOS differential test transistors.

17. A semiconductor device comprising:
a substrate;
active circuitry on the substrate and comprising a plurality of differential transistor pairs; and
threshold voltage test circuitry on the substrate and comprising
a pair of differential test transistors replicating the differential transistor pairs within the active circuitry, each test transistor having a respective input and output, and
at least one gain stage configured to amplify a difference between the outputs of the differential test transistors for measuring a threshold voltage thereof;
wherein the plurality of differential transistor pairs and the pair of differential test transistors each comprises spaced apart source and drain regions, a channel region extending between the source and drain regions, and a gate overlying the channel region;
wherein each of the channel regions comprises a superlattice, the superlattice comprising a plurality of stacked groups of layers with each group of layers comprising a plurality of stacked base silicon monolayers defining a base semiconductor silicon and at least one oxygen monolayer thereon constrained within a crystal lattice of adjacent base silicon portions.

18. The semiconductor device of claim 17 wherein the at least one gain stage comprises a plurality of gain stages configured to successively amplify the difference between the outputs of the differential test transistors over an input voltage range.

19. The semiconductor device of claim 17 wherein the semiconductor substrate comprises a semiconductor wafer; wherein the active circuitry comprises a plurality of spaced apart active circuitry areas separated by scribe lines; and wherein the threshold voltage test circuitry is positioned within at least one of the scribe lines.

20. The semiconductor device of claim 17 wherein the active circuitry comprises at least one memory cell array.

21. The semiconductor device of claim 17 wherein the at least one gain stage comprises a sense amplifier coupled to first conduction terminals of the pair of differential test transistors, and a current source coupled to second conduction terminals of the pair of differential test transistors.

* * * * *